United States Patent
Kuwata

(10) Patent No.: US 10,763,096 B2
(45) Date of Patent: Sep. 1, 2020

(54) METHOD FOR NEUTRALIZING ION BEAM, AND APPARATUS USING THE METHOD

(71) Applicant: NISSIN ION EUQIPMENT CO., LTD., Kyoto (JP)

(72) Inventor: Yusuke Kuwata, Koka (JP)

(73) Assignee: NISSIN ION EQUIPMENT CO., LTD., Koka, Shiga (JP)

( * ) Notice: Subject to any disclaimer, the term of this patent is extended or adjusted under 35 U.S.C. 154(b) by 0 days.

(21) Appl. No.: 16/353,631

(22) Filed: Mar. 14, 2019

(65) Prior Publication Data
US 2020/0051801 A1     Feb. 13, 2020

(30) Foreign Application Priority Data
Aug. 9, 2018 (JP) ................................. 2018-149841

(51) Int. Cl.
*H01J 49/00* (2006.01)
*H01J 49/06* (2006.01)

(52) U.S. Cl.
CPC .......... *H01J 49/06* (2013.01); *H01J 49/0031* (2013.01)

(58) Field of Classification Search
CPC .. H01J 49/00; H01J 49/02; H01J 49/06; H01J 49/10; H01J 49/0027; H01J 49/0031
USPC .. 250/281, 282, 492.1, 492.2, 492.21, 492.3
See application file for complete search history.

(56) References Cited

U.S. PATENT DOCUMENTS

| | | | | |
|---|---|---|---|---|
| 4,698,236 A | * | 10/1987 | Kellogg | H01J 37/3178 250/492.2 |
| 5,814,819 A | | 9/1998 | Sinclair et al. | |
| 2008/0164408 A1 | * | 7/2008 | Lubicki | H02M 7/103 250/281 |
| 2010/0308215 A1 | * | 12/2010 | Vanderberg | H01J 37/147 250/281 |
| 2018/0023550 A1 | * | 1/2018 | Tsay | F03H 1/0031 60/202 |

FOREIGN PATENT DOCUMENTS

JP          11-96961 A      4/1999

* cited by examiner

*Primary Examiner* — Jason L McCormack
(74) *Attorney, Agent, or Firm* — Sughrue Mion, PLLC

(57) ABSTRACT

A method and apparatus are provided. The method includes selectively supplying a neutralizing gas to a position on a trajectory of an ion beam between an extraction electrode system and an analysis slit based on a composition of a dopant gas introduced into an ion source that produces the ion beam. The apparatus includes the ion source, the extraction electrode system, the analysis slit, and a gas supply system that selectively supplies the neutralizing gas to the position on the trajectory.

11 Claims, 7 Drawing Sheets

METHOD FOR NEUTRALIZING ION BEAM, AND APPARATUS USING THE METHOD

CROSS-REFERENCE TO RELATED APPLICATION

This application claims priority from Japanese Patent Application No. JP2018-149841, filed in the Japanese Patent Office on Aug. 9, 2018, the disclosure of which is incorporated by reference herein in its entirety.

BACKGROUND

1. Field

The present disclosure relates to the field of ion implantation apparatuses, and more specifically to an improved method for neutralizing an ion beam, and an apparatus using the method.

2. Description of Related Art

In recent years, a ribbon-shaped ion beam (hereinafter referred to as "ribbon ion beam") which is long in one direction has been used to meet the demands for larger substrate size, higher beam current and lower beam energy of an ion beam, and others. The higher beam current is intended to cope with a larger dose amount, and the lower beam energy intended to enable shallower ion implantation. An ion beam composed of positive ions is a positively charged beam. Thus, a phenomenon that the positive ions within the ion beam mutually repel each other, i.e., so-called beam blow-up (also referred to as "space charge effect"), become particularly problematic in a high-current, low-energy ion beam.

As a technique for reducing the "beam blow-up" which becomes problematic in such high current, low energy applications, JP H11-96961A describes a system and method for neutralizing an ion beam in an ion implantation apparatus using water vapor.

In a transport path of the positive ion beam, it is advantageous to save the amount of neutralizing gas for suppressing spreading of the ion beam due to the beam blow-up.

SUMMARY

It is an aspect to provide a method and an ion implantation apparatus capable of saving the amount of ion beam neutralizing gas for suppressing the beam blow-up.

According to an aspect of one or more embodiments, there is provided a method comprising selectively supplying a neutralizing gas to a position on a trajectory of an ion beam between an extraction electrode system and an analysis slit based on a composition of a dopant gas introduced into an ion source that produces the ion beam.

According to another aspect of one or more embodiments, there is provided an apparatus comprising an ion source which ionizes a dopant gas; an extraction electrode system which extracts ionized ions in an ion beam from the ion source; a mass analysis electromagnet which mass-analyzes the ion beam; an analysis slit disposed downstream of the mass analysis electromagnet; a gas supply system disposed at a position on a trajectory of the ion beam between the extraction electrode system and the analysis slit to supply a neutralizing gas to the ion beam; and a controller which inhibits a supply of the neutralizing gas f to the position when the dopant gas contains halogen, and supplies the neutralizing gas to the position to neutralize the ion beam, when the dopant gas contains no halogen.

According to another aspect of one or more embodiments, there is provided an apparatus comprising an ion source which ionizes a dopant gas; an extraction electrode system which extracts an ion beam from the ion source; a mass analysis electromagnet which mass-analyzes the ion beam; an analysis slit disposed downstream of the mass analysis electromagnet; and a gas supply system configured to, based on a composition of the dopant gas, selectively supply a neutralizing gas to a position on a trajectory of the ion beam between the extraction electrode system and the analysis slit.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

The embodiments of the present disclosure may be diversely modified. However, it is to be understood that the present disclosure is not limited to a specific embodiment, but includes all modifications, equivalents, and substitutions of embodiments disclosed herein without departing from the scope and spirit of the present disclosure and claims.

Figure 1:
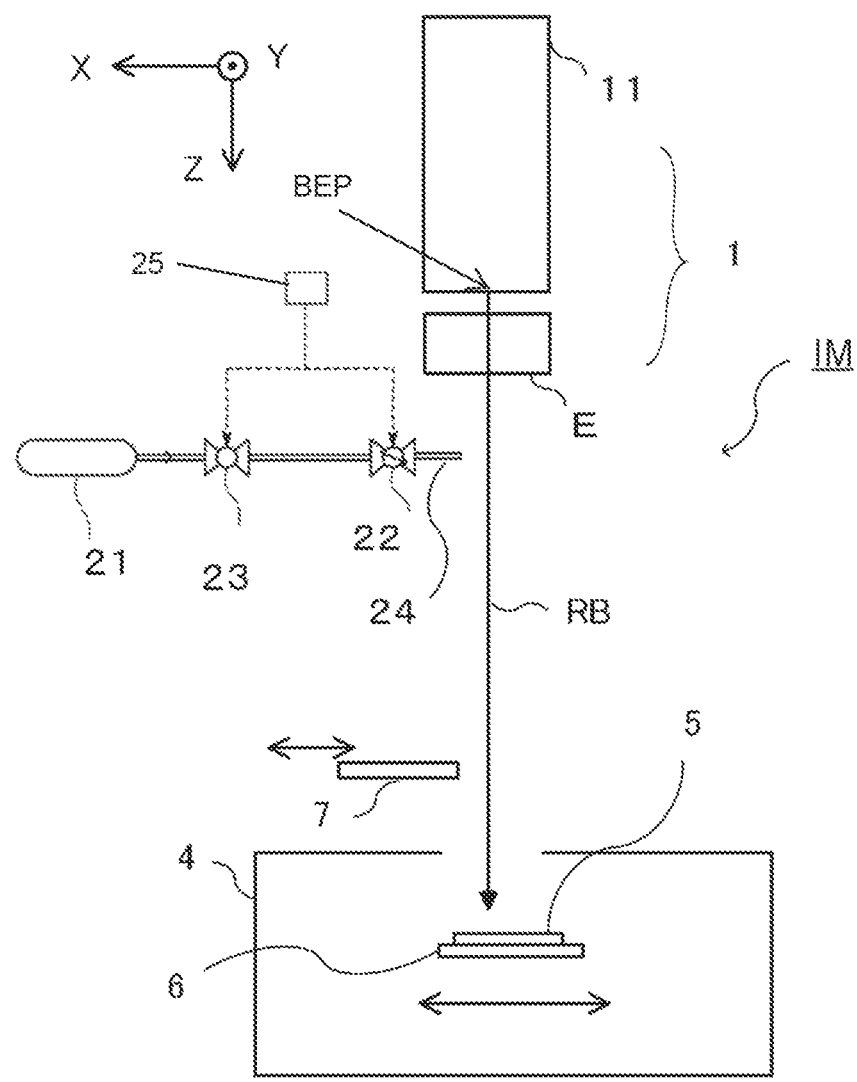
FIG. 1 is a schematic diagram of an ion implantation apparatus according to an embodiment.

FIG. 1 depicts an ion implantation apparatus IM according to an embodiment. The ion implantation apparatus IM will be described based on an example in which an ion beam is a ribbon ion beam.

The ion implantation apparatus IM includes an ion source 1 configured to generate a ribbon ion beam RB, and equipped with a plasma generation container 11 which is long in a Y direction indicated in FIG. 1 and is formed with a beam extraction port BEP in one sidewall thereof. The plasma generation container 11 may be rectangular parallelepiped-shaped.

Another sidewall of the plasma generation container 11 is provided with a gas introduction port for introducing a dopant gas into the inside of the plasma generation container 11 therethrough. Further, a sidewall of the plasma generation container 11 facing in the Y direction is provided with a cathode, such as a filament, for emitting electrons for ionizing the dopant gas to generate plasma of the dopant gas inside the container. The beam extraction port BEP is formed in the sidewall of the plasma generation container 11 facing in a Z direction indicated in FIG. 1, to communicate between the inside and outside of the plasma generation container 11.

The ion source 1 is further equipped with an extraction electrode system E disposed downstream of the beam extraction port BEP (on one side of the beam extraction port facing in the Z direction), and includes a plurality of electrodes for extracting the ribbon ion beam RB through the beam extraction port BEP by a given energy.

The ion implantation apparatus IM further includes a flag Faraday 7 for monitoring a ribbon ion beam current, and a process chamber 4, which are arranged downstream of the extraction electrode system E in this order. The flag Faraday 7 is configured to move into and out of a trajectory (see arrow in FIG. 1) of the ribbon ion beam RB (herein after referred to as "ribbon ion beam trajectory"). In the process chamber 4, a non-depicted drive mechanism is installed which is operable to reciprocatingly convey a holder 6 supporting a substrate 5, such that the holder 6 is moved across the ribbon ion beam RB in directions of the arrows in FIG. 1.

The ion implantation apparatus IM further includes a gas supply system including a gas cylinder 21, an on-off valve 23, a mass flow controller 22, a neutralizing gas supply port 24, and a controller 25. The gas cylinder 21 stores therein a neutralizing gas. The on-off valve 23 and the mass flow controller 22 are installed in a neutralizing gas passage to adjust a flow rate of the neutralizing gas to the neutralizing gas supply port 24 for supplying the neutralizing gas to a position on a trajectory of the ribbon ion beam RB between the extraction electrode system E and the substrate 5. The controller 25 controls the on-off valve 23 and mass flow controller 22 to supply or inhibit the supply of neutralizing gas to the neutralizing gas supply port 24 based on a composition of the dopant gas as discussed further below, and to regulate the flow rate of the neutralizing gas through the neutralizing gas supply port 24. It should be noted that the position of the neutralizing gas supply port 24 in FIG. 1 is only an example, and other positions along the trajectory of the ribbon ion beam RB are contemplated.

In a case where the dopant gas to be introduced into the plasma generation container 11 is a halogen-containing gas such as $BF_3$, $PF_3$ or $GeF_4$, a halogen component thereof is likely to be negatively ionized, because of the high affinity of halogen-containing gas for electrons. Such a negative ion component generated in the plasma generation container 11 will leak out within the ion implantation apparatus IM into the ribbon ion beam trajectory, to effectively suppress the beam blow-up in the ribbon ion beam. Therefore, in this case, there is no need to supply the neutralizing gas to a position on the ribbon ion beam trajectory.

On the other hand, in a case where the dopant gas to be introduced into the plasma generation container 11 is not a halogen-containing gas, i.e., is a halogen-free gas, such as $PH_3$, $AsH_3$, $N_2$ or $CO_2$, it cannot be expected that a negative ion component is generated in the plasma generation container 11. Therefore, in this case, the neutralizing gas is supplied to a position on the ribbon ion beam trajectory. The ribbon ion beam collides with molecules of the supplied neutralizing gas to generate a negative ion component, and the ribbon ion beam is neutralized by the generated negative ion component. By neutralizing the ribbon ion beam, it is possible to improve beam transport efficiency.

As above, depending of the type of dopant gas to be introduced into the plasma generation container 11, it is determined whether the supply of the neutralizing gas is inhibited or permitted. This determination makes it possible to save the amount of the neutralizing gas and thus bring out a significant effect of reducing costs.

Generally, an ion implantation apparatus may be classified into a non-mass analysis type and a mass analysis type. The mass analysis-type ion implantation apparatus is equipped with a mass analysis electromagnet, so that a beam line thereof becomes longer as compared to the non-mass analysis-type ion implantation apparatus.

In the mass analysis-type ion implantation apparatus having a relatively long beam trajectory, beam transport efficiency varies depending on to which position on the ribbon ion beam trajectory the neutralizing gas is supplied. Further, the mass analysis electromagnet is designed to supply a homogeneous magnetic field with respect to the ribbon ion beam, in view of production cost and power consumption. Thus, the mass analysis electromagnet is configured to have a relatively narrow internal space for allowing the ribbon ion beam to pass therethrough. Further, for mass analysis, the mass analysis electromagnet has a function of turning the ribbon ion beam over a relatively long distance, so that a beam transport distance within the mass analysis electromagnet is relatively long, as compared to other beam optical elements in the beam line. Therefore, an electrically-charged ion beam will be spread due to the beam blow-up. Considering all the above, the beam transport efficiency can be significantly improved by suppressing the beam blow-up within the mass analysis electromagnet.

Figure 2:
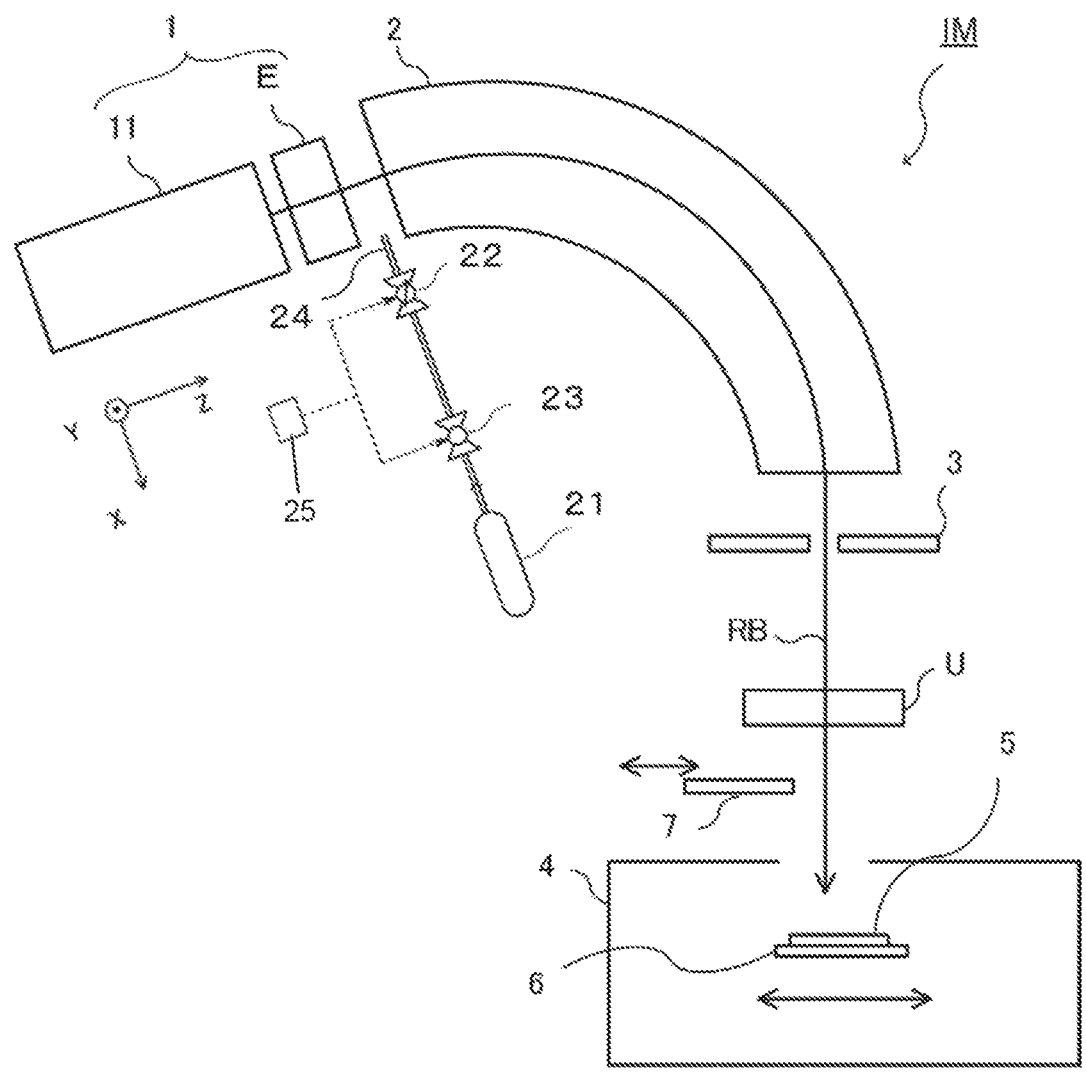
FIG. 2 is a schematic diagram of an ion implantation apparatus according to another embodiment.

FIG. 2 depicts an ion implantation apparatus, specifically a mass analysis-type ion implantation apparatus, according to another embodiment.

The ion implantation apparatus IM of FIG. 2 comprises an ion source 1 configured to generate a ribbon ion beam RB. The ion source 1 includes a plasma generation container 11 into which a dopant gas is introduced so as to generate a plasma of the dopant gas, and an extraction electrode system E disposed downstream of the plasma generation container 11 and composed of a plurality of electrodes for extracting the ribbon ion beam RB.

The ion implantation apparatus IM further comprises a mass analysis electromagnet 2 and an analysis slit 3, which are disposed downstream of the extraction electrode system E in this order and are configured to allow an ion having a desired mass in the ribbon ion beam RB extracted by the extraction electrode system E to pass therethrough.

The ion implantation apparatus IM further comprises a gas supply system including a gas cylinder 21, an on-off valve 23, a mass flow controller 22, a neutralizing gas supply port 24, and a controller 25. The gas cylinder 21 stores therein a neutralizing gas. The on-off valve 23 and the mass flow controller 22 are installed in a neutralizing gas passage to adjust a flow rate of the neutralizing gas to the neutralizing gas supply port 24 for supplying the neutralizing gas to a position on a trajectory of the ribbon ion beam RB between the extraction electrode system E and an inlet of the mass analysis electromagnet 2. The controller 25 controls the on-off valve 23 and mass flow controller 22 to supply or inhibit the supply of neutralizing gas to the neutralizing gas supply port 24 based on a composition of the dopant gas as described above, and to regulate the flow rate of the neutralizing gas through the neutralizing gas supply port 24.

The controller 25 may include one or more microprocessors executing program code stored in a memory to control the on-off valve 23 and the mass flow controller 22. For example, the controller 25 may monitor the composition of the dopant gas, control the on-off valve 23 and the mass flow controller 22 to inhibit a supply of the neutralizing gas (i.e., not supply the neutralizing gas) when the dopant gas contains halogen, and control the on-off valve 23 and the mass flow controller 22 to supply the neutralizing gas when the dopant gas contains no halogen. Alternatively, in another embodiment, the composition of the dopant gas may be stored in a memory of the controller and the controller may access the memory to determine the composition of the dopant gas.

The ion implantation apparatus IM further comprises a current density distribution adjuster U, a flag Faraday 7 for monitoring a ribbon ion beam current, and a process chamber 4, which are arranged downstream of the analysis slit 3 in this order. The flag Faraday 7 is configured to move into and out of the ribbon ion beam trajectory. In the process chamber 4, a drive mechanism (not shown) is installed which is operable to reciprocatingly convey a holder 6 supporting a substrate 5, such that the holder 6 is moved across the ribbon ion beam RB in arrowed directions in FIG. 2.

Figure 3:
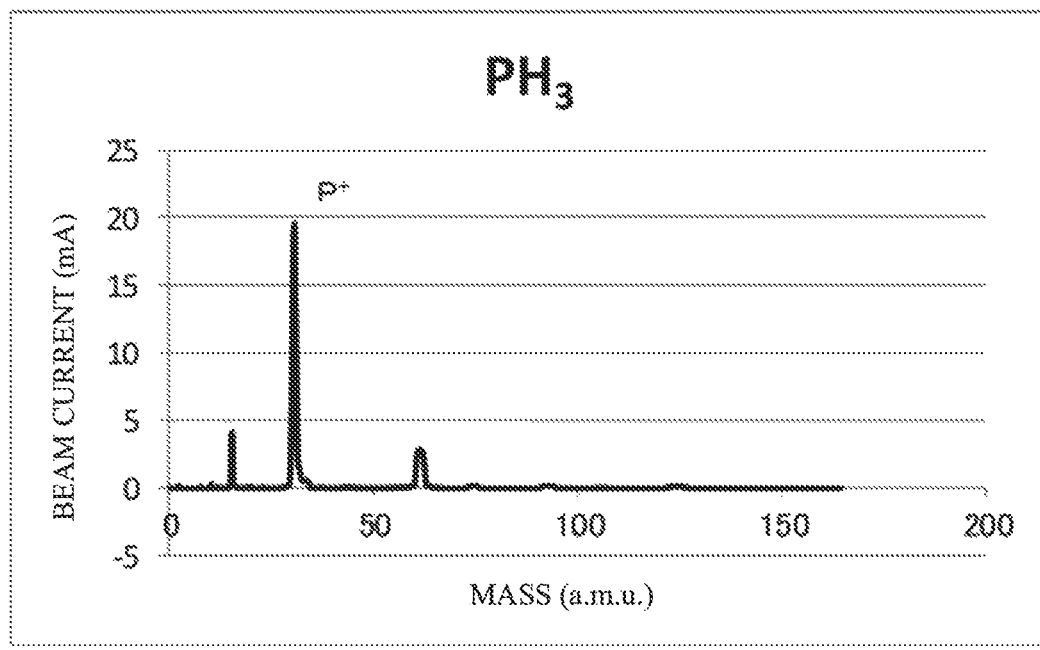
FIG. 3 is a chart showing a mass spectrum measured when a dopant gas is PH3.

FIG. 3 is a chart showing a mass spectrum measured in a mass analysis-type ion implantation apparatus when a dopant gas is $PH_3$. FIG. 3 shows a peak of a desired ion $P^+$, and peaks of other ions having a smaller mass and a larger mass.

Figure 4:
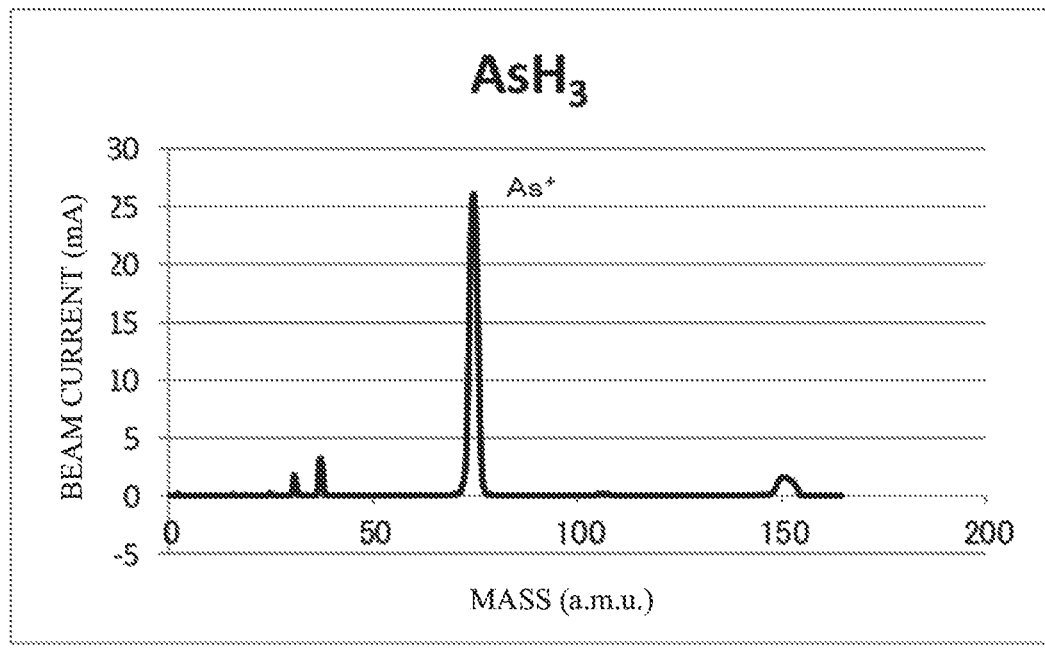
FIG. 4 is a chart showing a mass spectrum measured when a dopant gas is AsH3.

FIG. 4 is a chart showing a mass spectrum measured in a mass analysis-type ion implantation apparatus when a dopant gas is $AsH_3$. FIG. 4 shows a peak of a desired ion $As^+$, and peaks of other ions having a smaller mass and a larger mass.

Figure 5:
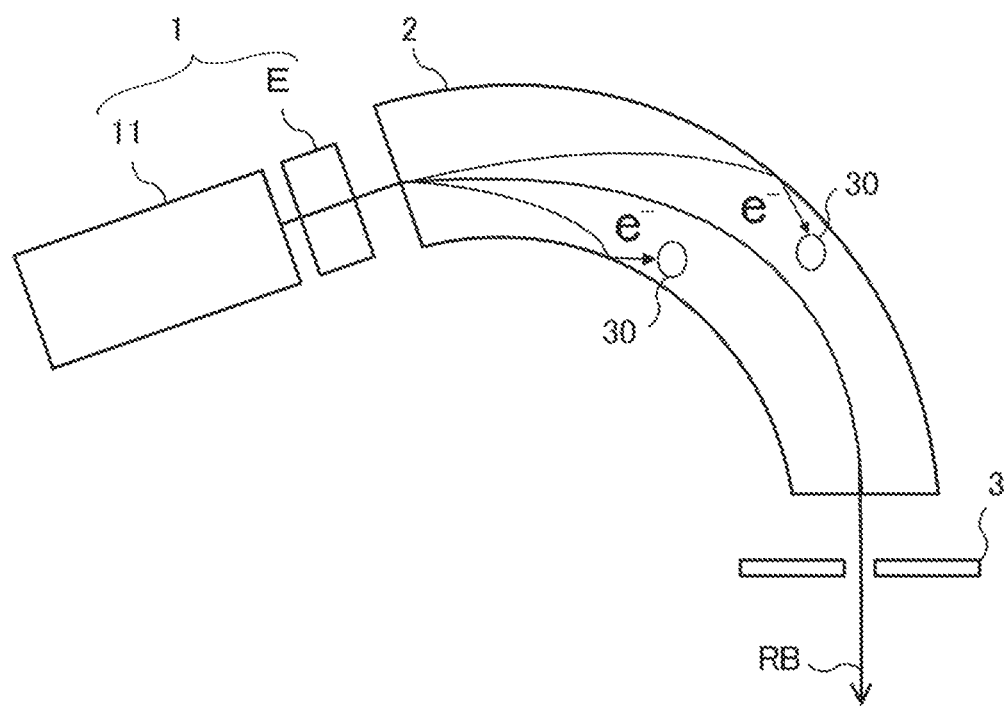
FIG. 5 is a schematic diagram for explaining a phenomenon that, when a dopant gas is PH3, negatively-charged ions are generated by collision between secondary electrons emitted from a liner of a mass analysis electromagnet, and molecules of a neutralizing gas.

FIG. 5 is a schematic diagram for explaining a phenomenon that, when the dopant gas is $PH_3$, negatively-charged ions are generated by collision between secondary electrons emitted from a liner of the mass analysis electromagnet, and molecules of the neutralizing gas.

In a case where the dopant gas is $PH_3$ or $AsH_3$, among ions other than the desired ion, an ion having a smaller mass and an ion having a larger mass collide, with an inner region and an outer region, respectively, of a carbon liner (not shown) of the mass analysis electromagnet 2, to generate secondary electrons. When the neutralizing gas is supplied to a position on the trajectory of the ribbon ion beam RB between the extraction electrode system E and the analysis slit 3, the secondary electrons generated inside the mass analysis electromagnet collide with molecules 30 of the neutralizing gas supplied to the position on the trajectory of the ribbon ion beam RB to generate negatively-charged ions. Accordingly, the ribbon ion beam is neutralized by the negatively-charged ions. It is noted that the components for supplying the neutralizing gas are not shown in FIG. 5 to simplify the figure.

Figure 6:
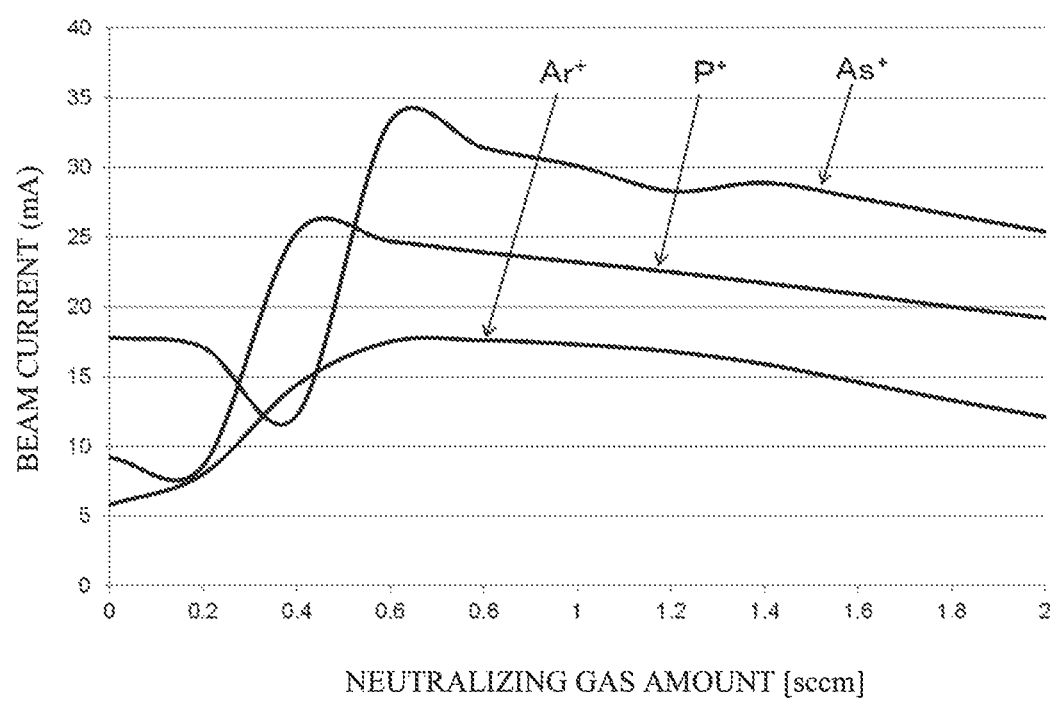
FIG. 6 is a graph of experimental data showing a change in beam current with respect to a change in amount of a neutralizing gas, according to an embodiment.
Figure 7:
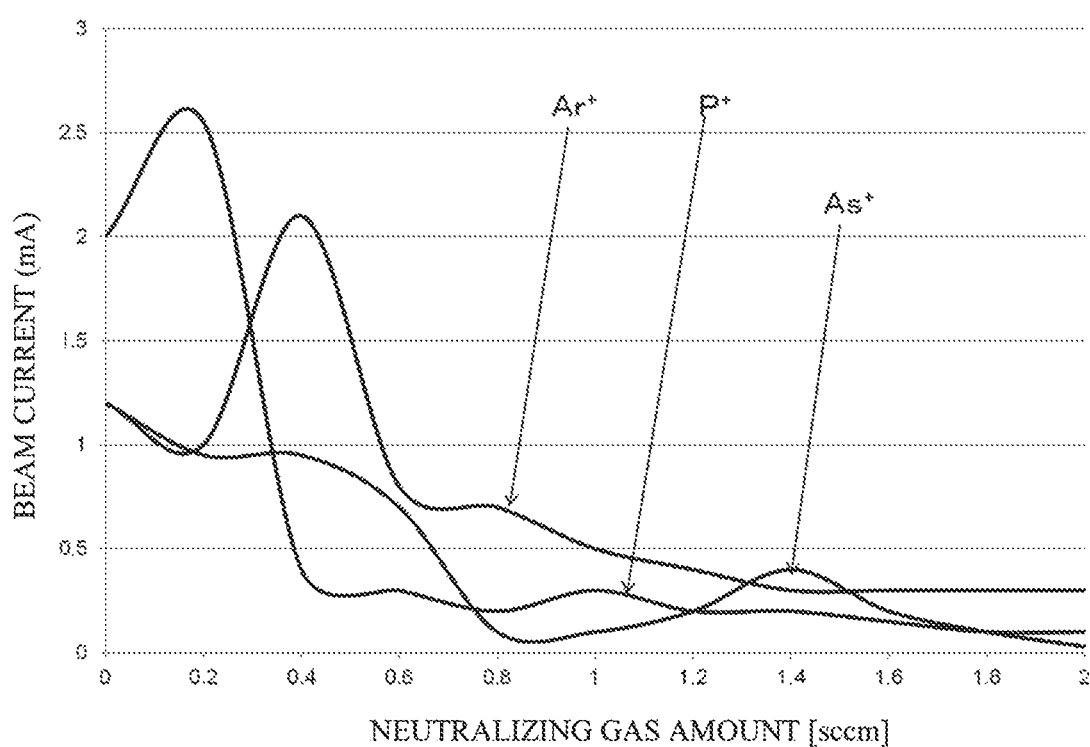
FIG. 7 is a graph of experimental data showing the rate of change of a beam current with respect to a change in amount of a neutralizing gas, according to an embodiment.

FIG. 6 is a graph of experimental data showing a change in beam current with respect to a change in amount of the neutralizing gas, and FIG. 7 is a graph of experimental data showing a rate of change of a beam current with respect to a change in amount of the neutralizing gas. The beam current and the beam current change rate of the ribbon ion beam shown in FIGS. 6 and 7, respectively, are values monitored by the flag Faraday 7.

FIGS. 6 and 7 show respectively that, along with an increase in amount of the neutralizing gas, the beam current increases, and the beam current change rate decreases.

The neutralizing gas to be supplied to a position on the trajectory of the ribbon ion beam RB may be a halogen-containing gas which has high affinity for electrons, i.e., is more likely to be negatively ionized.

The amount of the neutralizing gas to be supplied to a position on the trajectory of the ribbon ion beam RB may be finely adjusted by the mass flow controller 22. This fine adjustment makes it possible to optimize the amount of the neutralizing gas to be supplied.

In the ion implantation apparatus depicted in FIG. 2, the neutralizing gas supply port 24 of the gas supply system is disposed at a position between the extraction electrode system E and an inlet of the mass analysis electromagnet 2. In this case, the neutralizing gas supply port 24 may be located at a longitudinal midpoint in the Y-direction in a cross-section of the ribbon ion beam. This location makes it possible to efficiently perform the neutralization of the ribbon ion beam.

Figure 8:
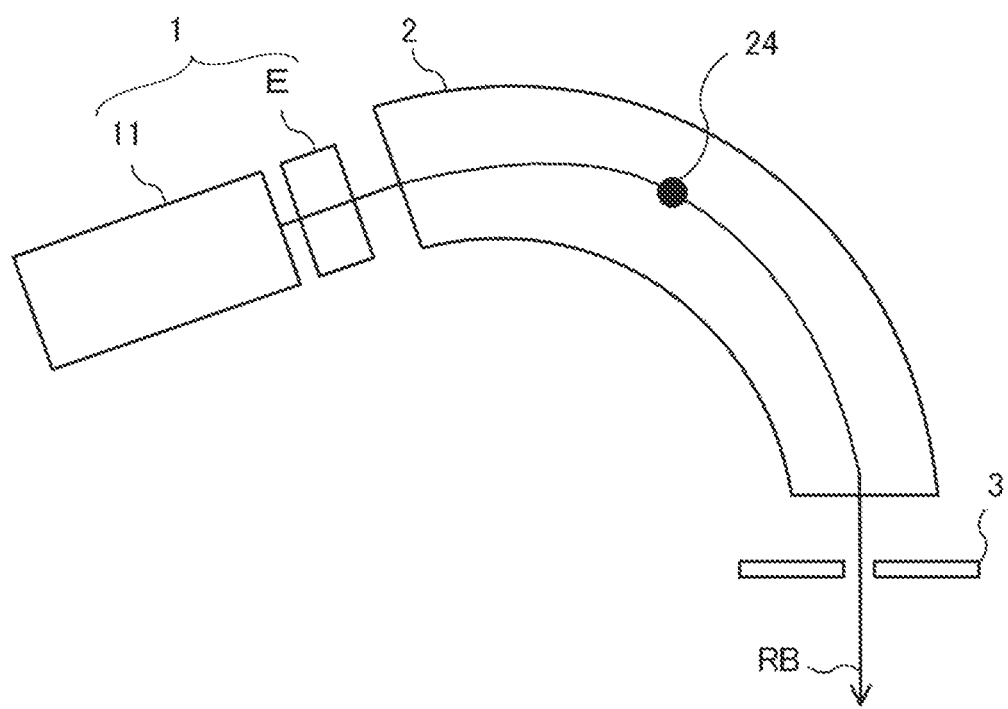
FIG. 8 is a schematic diagram of an example of a modification of the ion implantation apparatus in FIG. 2, according to an embodiment.

Alternatively, the neutralizing gas supply port 24 of the gas supply system may be located at a midpoint on a trajectory of the ribbon ion beam RB within the mass analysis electromagnet 2, as depicted in FIG. 8. This location makes it possible to efficiently perform the neutralization of the ribbon ion beam.

Although the above embodiments have been described based on an example in which the ion beam is a ribbon ion beam, a type of ion beam is not limited to the ribbon ion beam.

It should be understood that the present disclosure is not limited to the above embodiments, but various other changes and modifications may be made therein without departing from the spirit and scope of the appended claims.

What is claimed is:

1. A method comprising:
selectively supplying a neutralizing gas to a position on a trajectory of an ion beam between an extraction electrode system and an analysis slit based on a composition of a dopant gas introduced into an ion source that produces the ion beam,
wherein:
in response to the dopant gas containing halogen, inhibiting a supply of the neutralizing gas to the position on the trajectory; and
in response to the dopant gas containing no halogen, supplying the neutralizing gas to the position on the trajectory.

2. The method as recited in claim 1, wherein the position is between the extraction electrode system and an inlet of a mass analysis electromagnet provided upstream of the analysis slit along the trajectory.

3. The method as recited in claim 1, wherein the neutralizing gas is a halogen-containing gas.

4. The method as recited in claim 1, wherein an amount of the neutralizing gas that is supplied is adjusted by a mass flow controller.

5. An apparatus comprising:
an ion source which ionizes a dopant gas;
an extraction electrode system which extracts ionized ions in an ion beam from the ion source;
a mass analysis electromagnet which mass-analyzes the ion beam;
an analysis slit disposed downstream of the mass analysis electromagnet;
a gas supply system disposed at a position on a trajectory of the ion beam between the extraction electrode system and the analysis slit to supply a neutralizing gas to the ion beam; and
a controller which inhibits a supply of the neutralizing gas to the position when the dopant gas contains halogen, and supplies the neutralizing gas to the position to neutralize the ion beam, when the dopant gas contains no halogen.

6. The apparatus as recited in claim 5, wherein the gas supply system comprises:
a gas cylinder that stores the neutralizing gas;
a neutralizing gas supply port located at the position on the trajectory;
an on-off valve; and
a mass flow controller,
wherein controller that controls the on-off valve and the mass flow controller to supply the neutralizing gas to the neutralizing gas supply port.

7. The apparatus as recited in claim 6, wherein the ion beam is a ribbon ion beam, and wherein the neutralizing gas supply port is located at a longitudinal midpoint in a cross-section of the ribbon ion beam.

8. The apparatus as recited in claim 6, wherein the ion beam is a ribbon ion beam, and wherein the neutralizing gas supply port is located at a midpoint on the trajectory of the ribbon ion beam within the mass analysis electromagnet.

9. An apparatus comprising:
an ion source which ionizes a dopant gas;
an extraction electrode system which extracts an ion beam from the ion source;
a mass analysis electromagnet which mass-analyzes the ion beam;
an analysis slit disposed downstream of the mass analysis electromagnet; and
a gas supply system configured to, based on a composition of the dopant gas, selectively supply a neutralizing gas to a position on a trajectory of the ion beam between the extraction electrode system and the analysis slit,
wherein the gas supply system inhibits supply of the neutralizing gas in response to the dopant gas containing halogen, and supplies the neutralizing gas in response to the dopant gas not containing halogen.

10. The apparatus as recited in claim 9, wherein the gas supply system comprises:
a gas cylinder that stores the neutralizing gas;
a neutralizing gas supply port located at the position on the trajectory;
an on-off valve;
a mass flow controller; and
a controller that controls the on-off valve and the mass flow controller to supply the neutralizing gas to the neutralizing gas supply port.

11. The apparatus as recited in claim 10, wherein the controller controls the on-off valve and the mass flow controller to inhibit supply of the neutralizing gas when the dopant gas contains halogen, and to supply the neutralizing gas when the dopant gas does not contain halogen.

* * * * *